US012796173B2

(12) United States Patent
Choi et al.

(10) Patent No.: US 12,796,173 B2
(45) Date of Patent: Nov. 10, 2026

(54) SEMICONDUCTOR LIGHT-EMITTING ELEMENT AND DISPLAY DEVICE INCLUDING SAME

(71) Applicant: LG ELECTRONICS INC., Seoul (KR)

(72) Inventors: Hwanjoon Choi, Seoul (KR); Byungjoon Rhee, Seoul (KR); Kyuhyun Bang, Seoul (KR); Kyoungtae Wi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 1032 days.

(21) Appl. No.: 17/925,152

(22) PCT Filed: May 14, 2020

(86) PCT No.: PCT/KR2020/006381

§ 371 (c)(1),
(2) Date: Nov. 14, 2022

(87) PCT Pub. No.: WO2021/230402

PCT Pub. Date: Nov. 18, 2021

(65) Prior Publication Data

US 2023/0178686 A1 Jun. 8, 2023

(51) Int. Cl.

*H10H 20/82* (2025.01)
*H10H 20/81* (2025.01)
(Continued)

(52) U.S. Cl.

CPC ............ *H10H 20/82* (2025.01); *H10H 20/81* (2025.01); *H10H 20/831* (2025.01); *H10H 20/01* (2025.01); *H10H 29/10* (2025.01)

(58) Field of Classification Search

CPC ........................................................ H10H 20/82
See application file for complete search history.

(56) References Cited

U.S. PATENT DOCUMENTS 6,137,183 A 10/2000 Sako
2015/0108534 A1 4/2015 Zeng et al.
(Continued)

FOREIGN PATENT DOCUMENTS

JP 3663938 B2 6/2005
JP 2007-49045 A 2/2007
(Continued)

OTHER PUBLICATIONS

International Search Report (PCT/ISA/210) issued in PCT/KR2020/006381, dated Feb. 9, 2021.

*Primary Examiner* — Leonard Chang
*Assistant Examiner* — Hajar Kolahdouzan
(74) *Attorney, Agent, or Firm* — Birch, Stewart, Kolasch & Birch, LLP

(57) ABSTRACT

Discussed is a semiconductor light emitting device that can include a light emitting structure comprising a first conductivity type semiconductor layer, an active layer and a second conductivity type semiconductor layer, a first pad electrode electrically connected to the first conductivity type semiconductor layer, a second pad electrode electrically connected to the second conductivity type semiconductor layer, a first pattern structure disposed on the first pad electrode, and a second pattern structure disposed on the second pad electrode, wherein the first pattern structure comprises a first metal pattern structure disposed on the first pad electrode, a first adhesive material disposed on the first metal pattern structure, and a first conductive particle disposed in the first metal pattern structure.

18 Claims, 8 Drawing Sheets

(51) Int. Cl.

| | |
|---|---|
| ***H10H 20/831*** | (2025.01) |
| *H10H 20/01* | (2025.01) |
| *H10H 29/10* | (2025.01) |

(56) References Cited

U.S. PATENT DOCUMENTS

| | | | | |
|---|---|---|---|---|
| 2018/0090639 | A1 | 3/2018 | Ting et al. | |
| 2018/0192495 | A1* | 7/2018 | Kim | H05B 33/10 |
| 2018/0240937 | A1* | 8/2018 | Park | H05K 1/111 |
| 2019/0131282 | A1* | 5/2019 | Liu | H01L 25/167 |
| 2019/0245120 | A1* | 8/2019 | Choi | C09K 11/7706 |
| 2020/0058838 | A1 | 2/2020 | Choi et al. | |
| 2020/0091385 | A1 | 3/2020 | Hsieh et al. | |
| 2020/0110295 | A1* | 4/2020 | Huang | G02F 1/134309 |
| 2021/0265327 | A1 | 8/2021 | Koo et al. | |
| 2021/0376211 | A1 | 12/2021 | Song | |
| 2022/0123175 | A1 | 4/2022 | Wi et al. | |
| 2022/0190220 | A1 | 6/2022 | Kang et al. | |
| 2022/0406982 | A1 | 12/2022 | Choi | |
| 2022/0416127 | A1 | 12/2022 | Choi et al. | |

FOREIGN PATENT DOCUMENTS

| | | | |
|---|---|---|---|
| KR | 10-2018-0055549 | A | 5/2018 |
| KR | 10-2020-0002733 | A | 1/2020 |
| KR | 10-2020-0005096 | A | 1/2020 |
| KR | 10-2020-0006952 | A | 1/2020 |
| KR | 10-2020-0007498 | A | 1/2020 |
| KR | 10-2020-0021858 | A | 3/2020 |
| KR | 10-2020-0026773 | A | 3/2020 |
| KR | 10-2020-0026774 | A | 3/2020 |

* cited by examiner

[FIG.1]
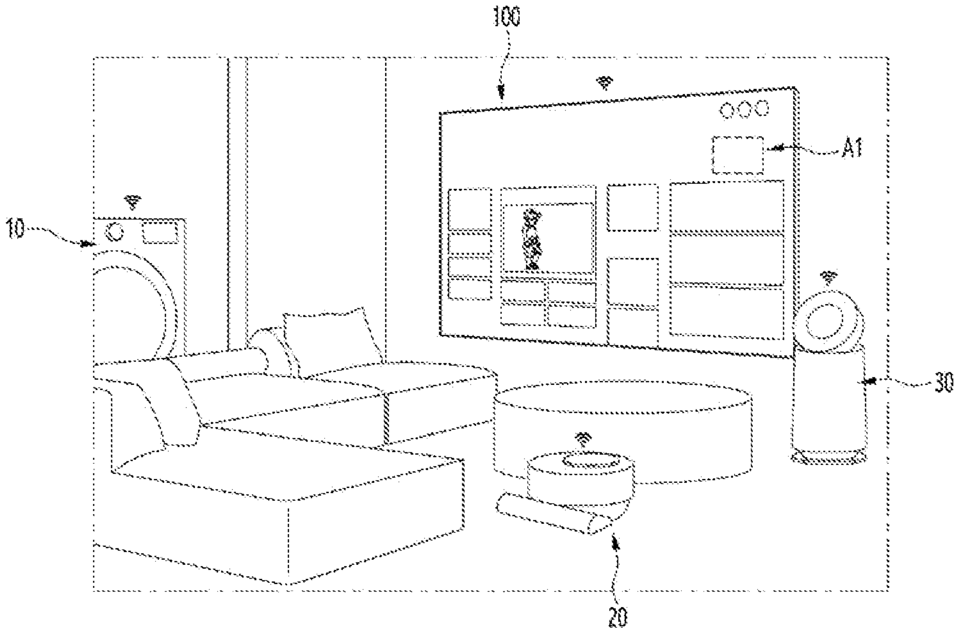
[FIG.2]
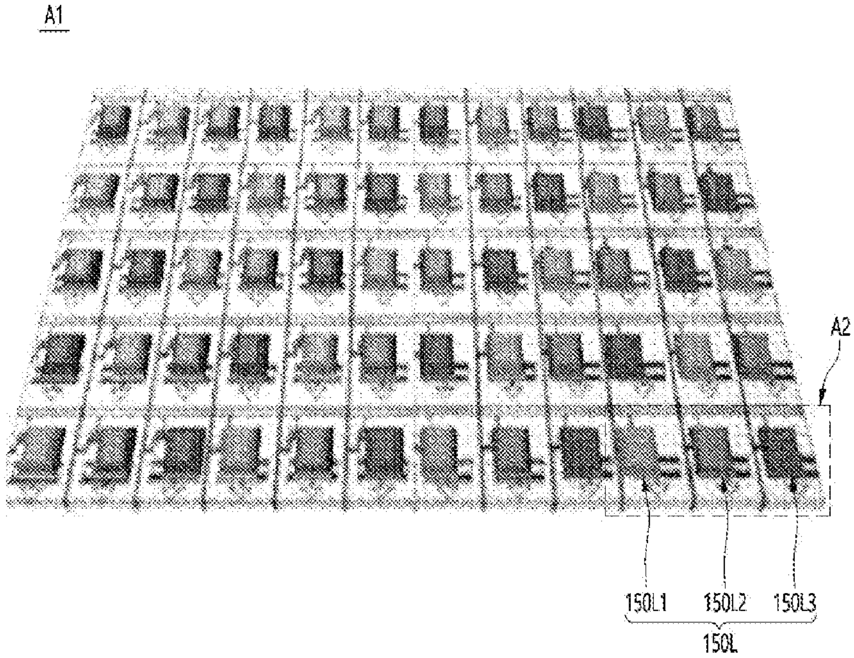

[FIG.3]
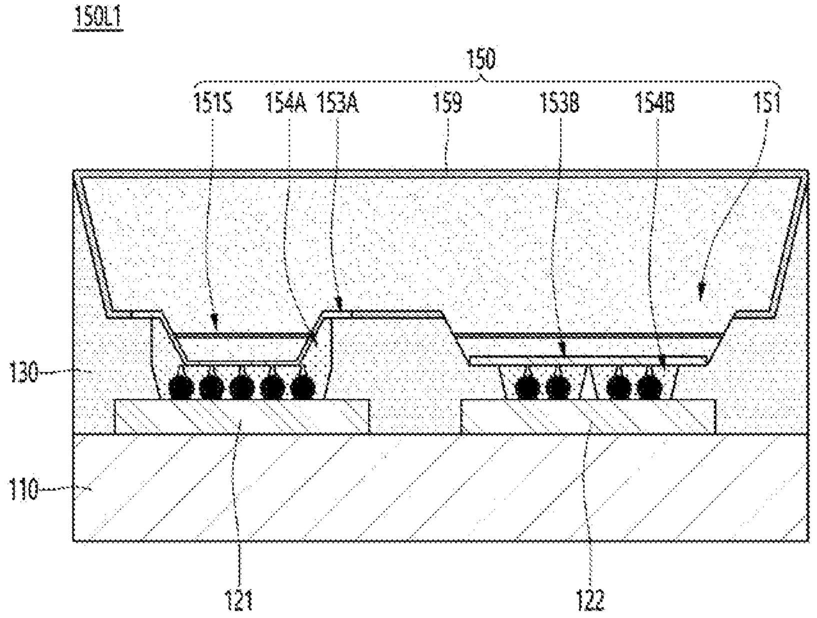
[FIG.4]
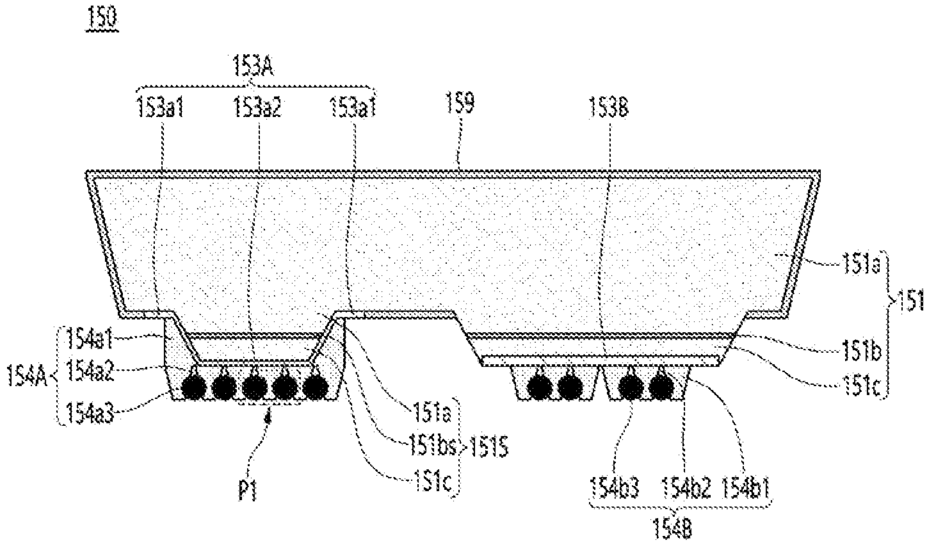

[FIG.5A]
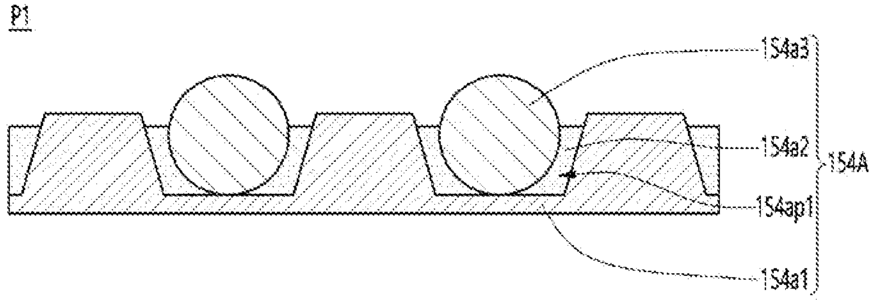
[FIG.5B]
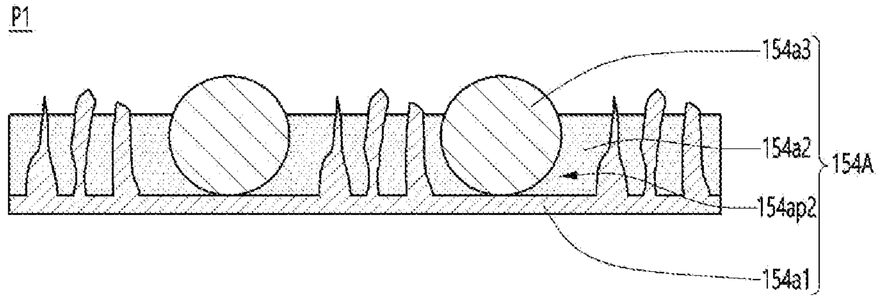
[FIG.5C]
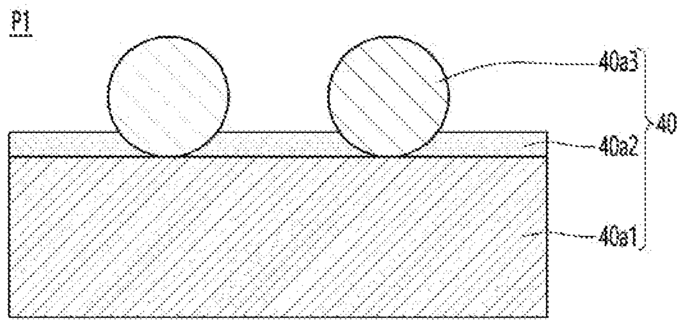

[FIG.5D]
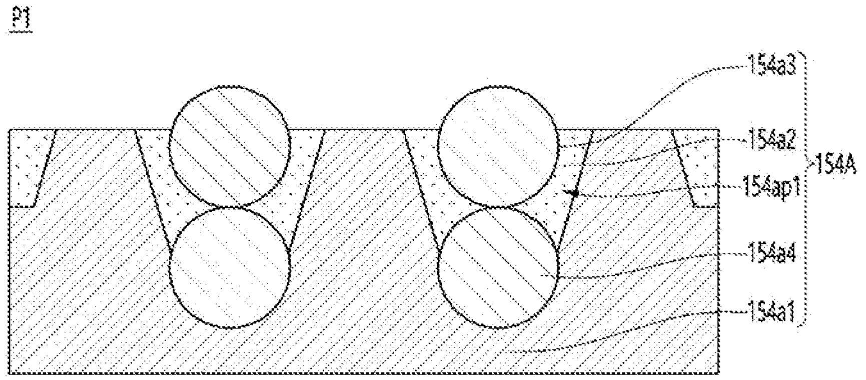
[FIG.6A]
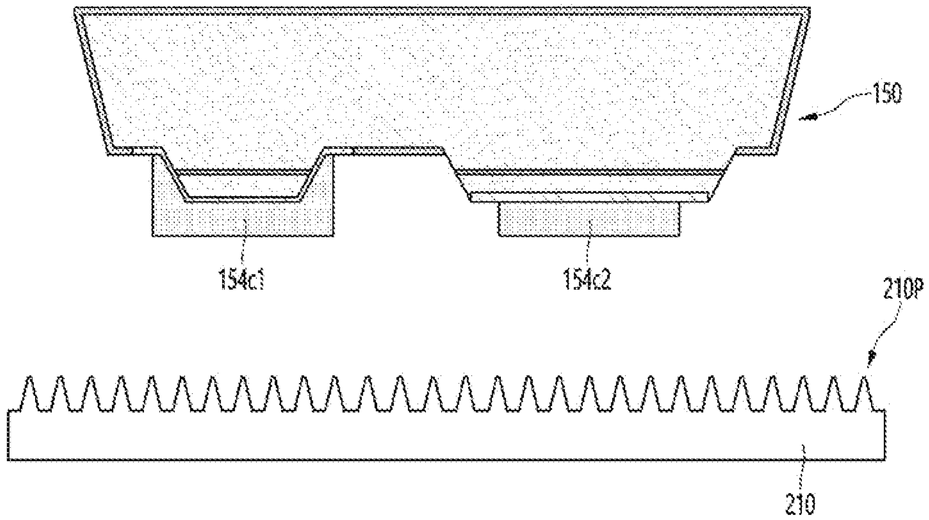
[FIG.6B]
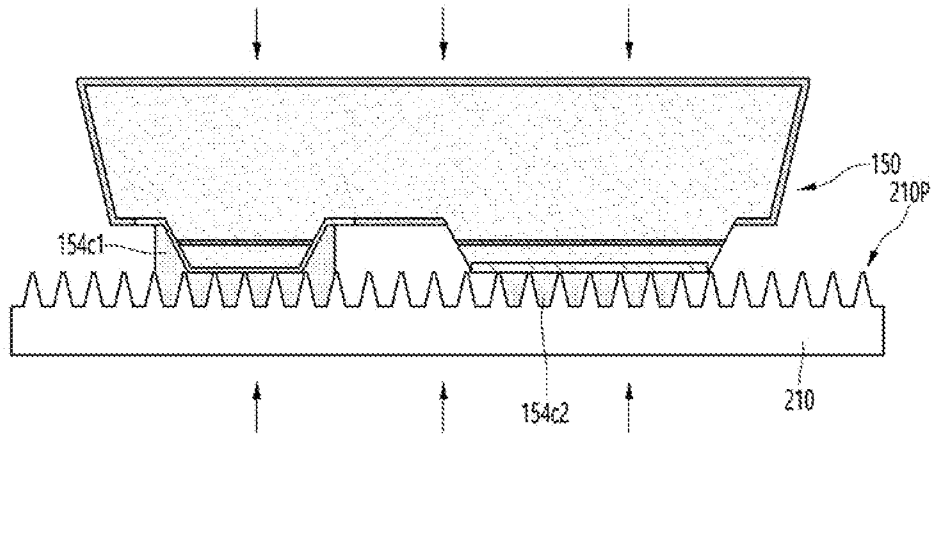

[FIG.6C]
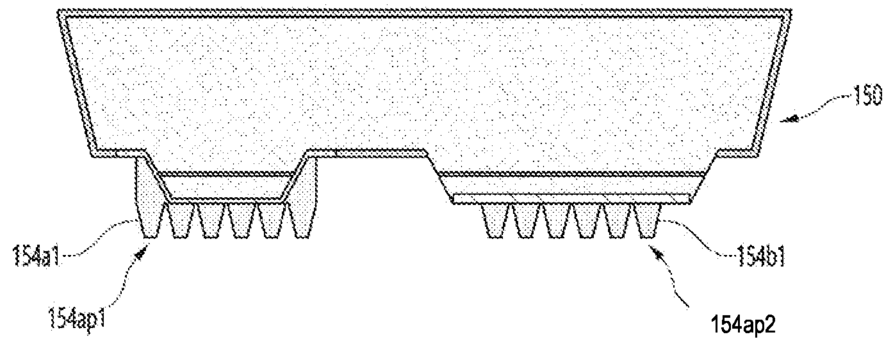
[FIG.7A]
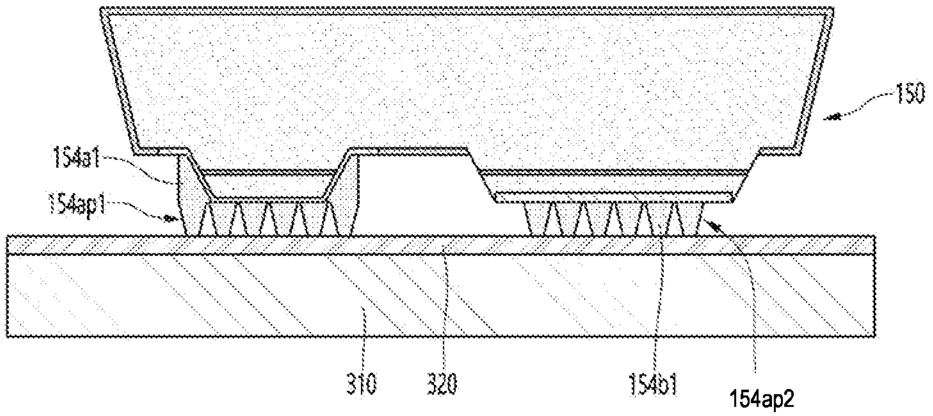
[FIG.7B]
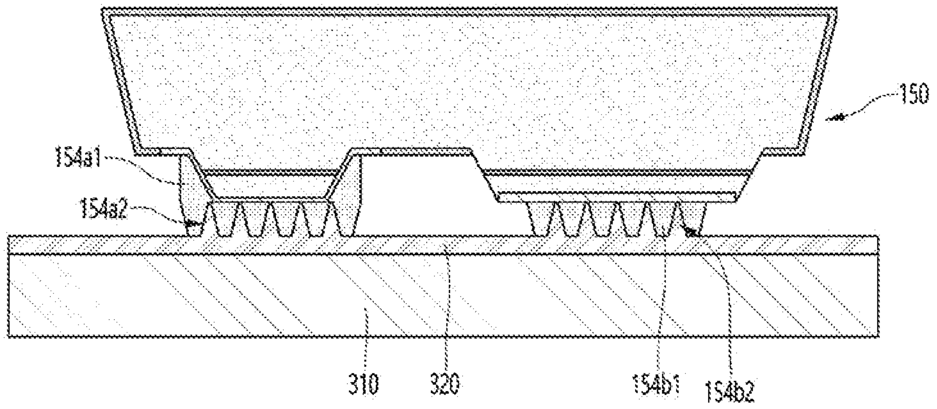

[FIG.8A]
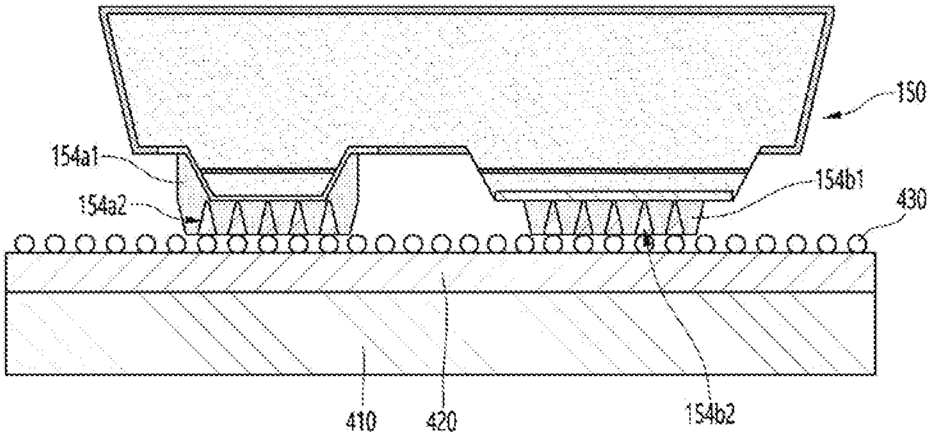
[FIG.8B]
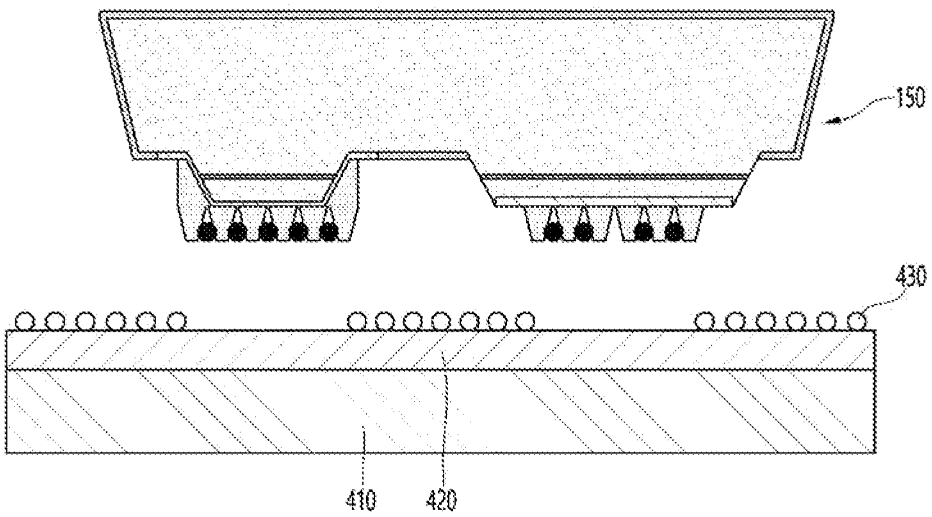

[FIG.9]
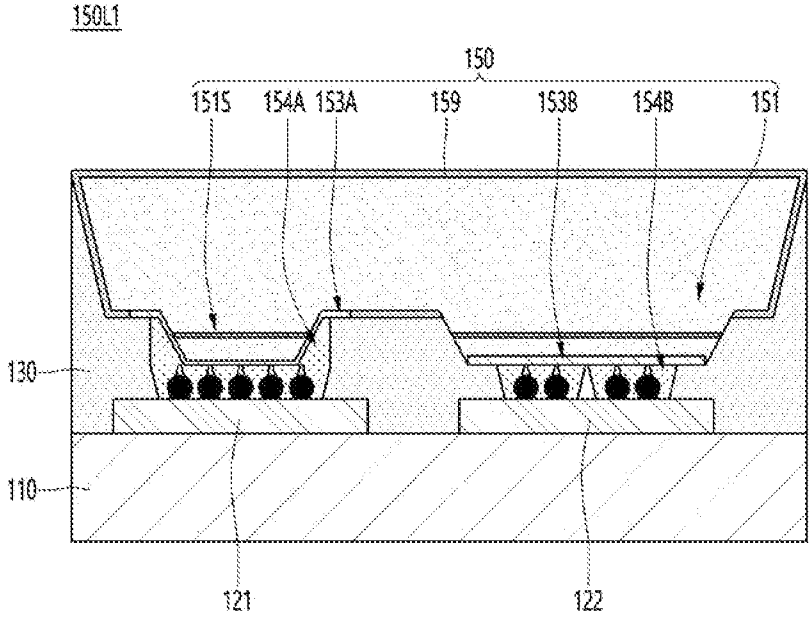
[FIG.10]
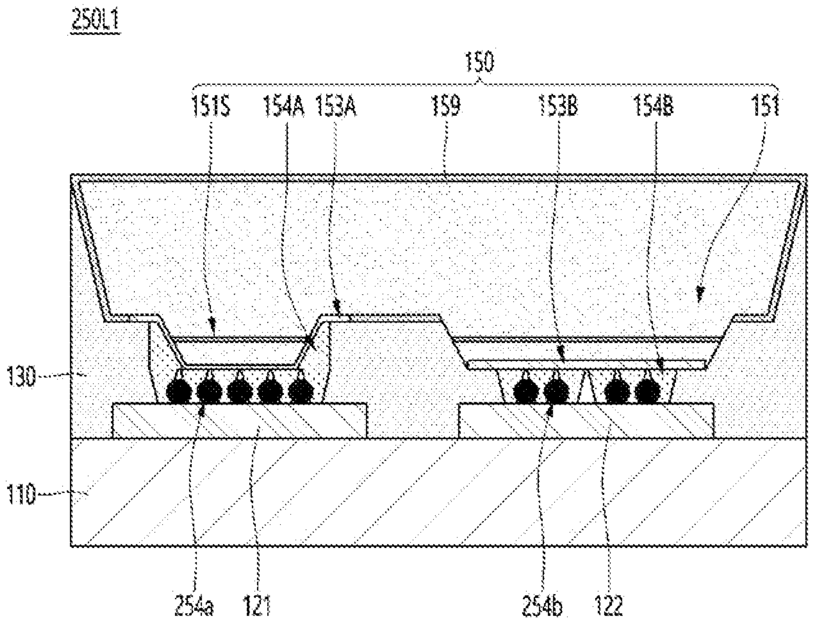

[FIG.11A]
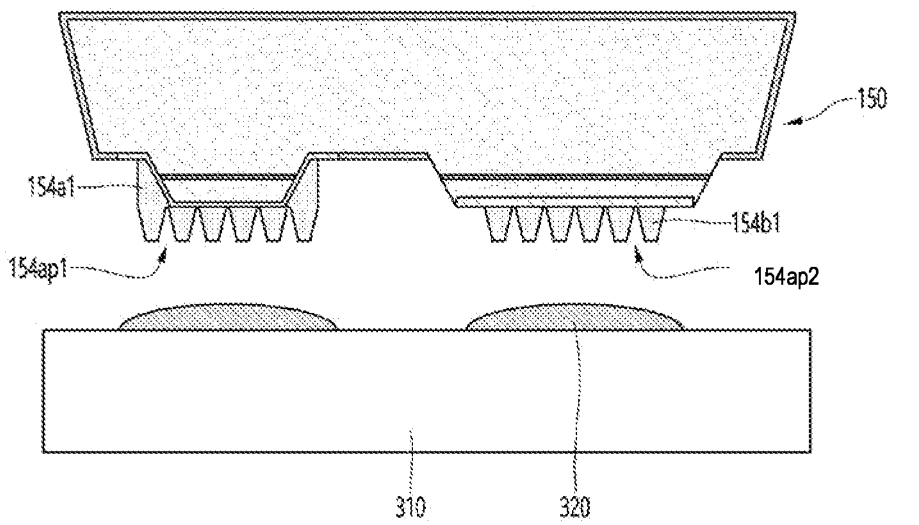
[FIG.11B]
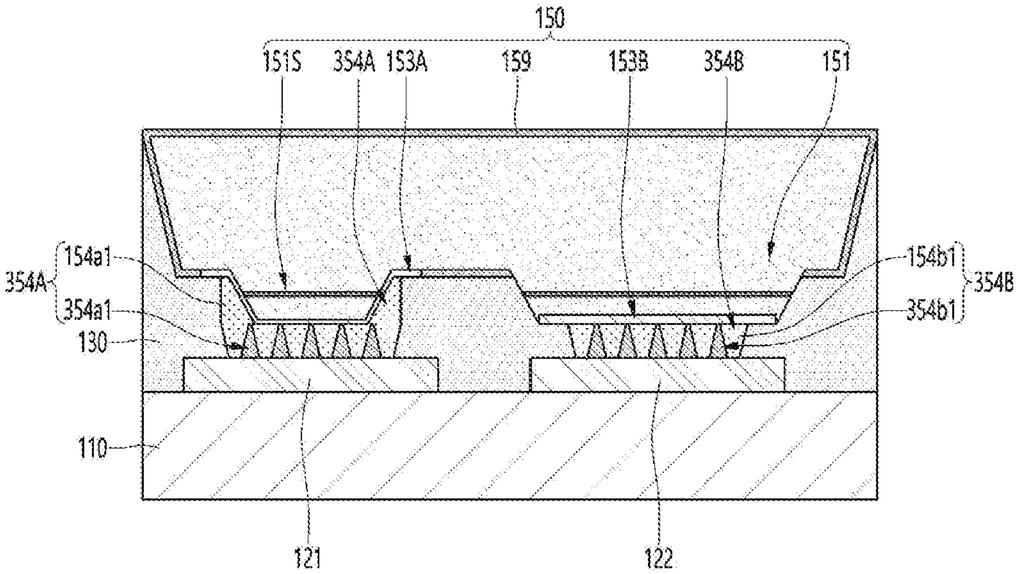

SEMICONDUCTOR LIGHT-EMITTING ELEMENT AND DISPLAY DEVICE INCLUDING SAME

CROSS REFERENCE TO RELATED APPLICATIONS

This application is the National Stage filing under 35 U.S.C. 371 of International Application No. PCT/KR2020/006381, filed on May 14, 2020, the contents of which is hereby expressly incorporated by reference into the present application.

Technical Field

The embodiment relates to a semiconductor light emitting device and a display device including the same.

Background Art

Technologies for realizing large-region displays include liquid crystal displays (LCD), OLED displays, and micro-LED displays.

Meanwhile, a micro-LED display is a display using a micro-LED, which is a semiconductor light emitting device having a diameter or cross-sectional region of 100 μm or less, as a display device.

Since micro-LED is used as a display element, micro-LED display has excellent performance in many characteristics such as contrast ratio, response speed, color gamut, viewing angle, brightness, resolution, lifespan, luminous efficiency and luminance.

In particular, micro-LED displays have the advantage of being able to separate and combine screens in a modular way, so that size or resolution can be freely adjusted and flexible displays can be implemented.

However, there is a technical problem in that it is difficult to quickly and accurately transfer the semiconductor light emitting device to the display panel because more than millions of semiconductor light emitting devices are required for a large micro-LED display.

Transfer technologies that have been recently developed include a pick and place process, a laser lift-off method, or a self-assembly method.

Meanwhile, in the related art, a melting point bonding method using a solder ball is employed as an electrical connection method for transferring a semiconductor light emitting device onto a panel substrate of a display.

However, in the case of melting point bonding using solder balls, since wetting properties are utilized, the surface condition between the contact interfaces is important, and a surface treatment process such as flux is required.

In particular, when using a solder ball to connect the pad electrode of the semiconductor light emitting device and the wiring electrode of the panel substrate, a certain amount of solder ball volume is required. But, as the size of the semiconductor light emitting device becomes smaller, when bonding by thermal bonding is applied, there is a problem in that the solder spreads out to the side and an electrical short occurs.

On the other hand, when the volume of the solder ball is reduced in order to prevent an electrical short circuit, there is a problem in that electrical characteristics are deteriorated or circuit open is generated.

Meanwhile, in the related art, a technique of attaching a semiconductor light emitting device to a panel substrate using an anisotropic conductive film (ACF) is used.

In the conventional ACF method, electrical connection is generated by physical contact due to the repulsive force of an internal polymer ball using pressure. However, in the case of bonding by pressure like ACF, the distribution on the electrical connection surface of the conductive particles is important. That is, in the case of electrical connection using conductive particles, the distribution ratio of conductive particles disposed between the pad electrode of the semiconductor light emitting device and the wiring electrode of the panel substrate is important.

For example, in the ACF process, bonding pressure is applied while conductive particles are located between the pad electrode of the semiconductor light emitting device and the wiring electrode of the panel substrate, by this bonding pressure, the flow of conductive particles occurs laterally. Due to the flow of the conductive particles, the distribution of conductive particles disposed between the pad electrode and the wiring electrode is low, so that there is a problem in that electrical conductivity is lowered or a circuit is opened electrically.

In addition, in the related art, in the transfer process of the semiconductor light emitting device to the panel substrate using conductive particles, there is a problem in that electrical conductivity is lowered due to a low distribution rate of conductive particles captured by a pad electrode of a semiconductor light emitting device and a low adhesion rate.

In addition, in the related art, in transferring a semiconductor light emitting device through a bonding process on a panel substrate using conductive particles, since the pad electrode, the wiring electrode, or the conductive particles are damaged by the pressure of the bonding process, there is a problem in that the mechanical reliability in the bonding process is lowered or the electrical and mechanical reliability of the semiconductor light emitting device is lowered when the display is driven after the bonding process.

DISCLOSURE

Technical Problem

One of the technical problems of the embodiment is to provide a semiconductor light emitting device and a display device including the same capable of solving a problem in which electrical properties are deteriorated or circuit breakage occurs due to the lateral flow of conductive particles as the bonding pressure is applied to the panel substrate of the semiconductor light emitting device using conductive particles in the transfer process In addition, one of the technical problems of the embodiment is to provide a semiconductor light emitting device and a display device including the same capable of solving a problem in that the electrical conductivity is lowered due to the low distribution rate of conductive particles captured by the pad electrode of the semiconductor light emitting device and the low adhesion rate, in transferring a semiconductor light emitting device using conductive particles to a panel substrate.

In addition, one of the technical problems of the embodiment is to provide a semiconductor light emitting device and a display device including the same capable of solving a problem in which the mechanical reliability in the bonding process is lowered due to damage to the pad electrode, the wiring electrode, or the conductive particles by the pressure of the bonding process, or the electrical and mechanical reliability of the semiconductor light emitting device is lowered when the display is driven after the bonding process, in transferring a semiconductor light emitting device through a bonding process on a panel substrate using conductive particles.

The technical problems of the embodiment are not limited to those described in this item, and include those that can be understood through the description of the invention.

The technical problems of the embodiment are not limited to those described in this item, and include those that can be understood through the description of the invention.

Technical Solution

Semiconductor light emitting device according to the embodiment can include a light emitting structure 151 including a first conductivity type semiconductor layer 151*a*, an active layer 151*b*, a second conductivity type semiconductor layer 151*c*, a first pad electrode 153A electrically connected to the first conductivity type semiconductor layer, a second pad electrode 153B electrically connected to the second conductivity type semiconductor layer, a first pattern structure 154A disposed on the first pad electrode and a second pattern structure 154B disposed on the second pad electrode.

The first pattern structure 154A can include a first metal pattern structure 154*a*1 disposed on the first pad electrode 153A, a first adhesive material 154*a*2 disposed in the first metal pattern structure 154*a*1 and a first conductive particle 154*a*3 disposed in the first metal pattern structure 154*a*1.

The first metal pattern structure 154*a*1 can include a predetermined first pattern space 154*ap*1, and the first adhesive material 154*a*2 can be disposed in the first pattern space 154*ap*1.

The first conductive particle 154*a*3 can be disposed in the first pattern space 154*ap*1.

The first pattern space 154*ap*1 can have a polyhedral shape.

The first pattern space 154*ap*2 can have an irregular shape.

A depth of the first pattern space 154*ap*1 can be smaller than a diameter of the conductive particles 154*a*3.

The embodiment can include an epitaxial structure 151S disposed spaced apart from the light emitting structure, and the epitaxial structure 151S can include a first conductivity type semiconductor layer 151*a*, an intrinsic semiconductor layer 151*bs*, and a second conductivity type semiconductor layer 151*c*.

The first pad electrode 153A can be disposed on the epitaxial structure 151S.

The first pad electrode 153A can include a first-first pad electrode 153*al* disposed on the first conductivity-type semiconductor layer 151*a* of the epitaxial structure 151S and a first-second pad electrode 153*a*2 disposed on the intrinsic semiconductor layer 151*bs* and the second conductivity-type semiconductor layer 151*c* of the epitaxial structure 151S.

A height of the first pad electrode 153A disposed on the epitaxial structure 151S can be substantially the same as a height of the second pad electrode 153B disposed on the light emitting structure.

The first pattern structure 154A can include a second conductive particle 154*a*4 disposed in the first metal pattern structure 154*a*1 and disposed to vertically overlap the first conductive particle 154*a*3.

A Display device including a semiconductor light emitting device according to an embodiment can include a panel substrate 110, a first wiring electrode 121 and a second wiring electrode 122 disposed on the panel substrate, and a semiconductor light emitting device 150 disposed on the first wire electrode and the second wiring electrode.

The first pad electrode 153A and the second pad electrode 153B of the semiconductor light emitting device can be electrically connected to the first wiring electrode 121 and the second wiring electrode 122 of the panel substrate 110, respectively.

Advantageous Effects

According to the semiconductor light emitting device and the display device including the same according to the embodiment, as the bonding pressure is applied to the panel substrate of the semiconductor light emitting device using conductive particles in the transfer process, there is a technical effect of improving the electrical properties by solving the problem of deterioration of electrical properties or circuit breakage due to the lateral flow of conductive particles.

In addition, according to the embodiment, in transferring the semiconductor light emitting device using the conductive particles to the panel substrate, there is a technical effect of remarkably improving the electrical conductivity by solving the problem of a decrease in electrical conductivity due to a low distribution rate of conductive particles captured by a pad electrode of a semiconductor light emitting device and a low adhesion rate.

In addition, according to the embodiment, in transferring the semiconductor light emitting device through a bonding process on the panel substrate using conductive particles, there is a technical effect of remarkably improving electrical and mechanical reliability by solving the problem in which the mechanical reliability in the bonding process is lowered due to damage to the pad electrode, the wiring electrode, or the conductive particles by the pressure of the bonding process, or the electrical and mechanical reliability of the semiconductor light emitting device when the display is driven after the bonding process is lowered.

The technical effects of the embodiment are not limited to those described in this item, and include those that can be understood through the description of the invention.

The technical effects of the embodiments are not limited to those described in this item, and include those that can be understood through the description of the invention.

DESCRIPTION OF DRAWINGS

FIG. 1 is an exemplary view in which a display device 100 according to an embodiment is disposed in a living room together with a washing machine 10, a robot cleaner 20, an air purifier 30, and the like.

FIG. 2 is an enlarged view of region A1 in the display device 100 of FIG. 1.

FIG. 3 is a cross-sectional view of a first semiconductor light emitting device region 150L1 among regions A2 which is one pixel in FIG. 2.

FIG. 4 is a cross-sectional view of the semiconductor light emitting device 150 applied to the display device 100 of the embodiment shown in FIG. 3.

FIG. 5A is an enlarged view (rotated 180 degrees) of the first pattern region P1 in FIG. 4.

FIG. 5B is another enlarged view of the first pattern region P1 in FIG. 4 (shown as rotated 180 degrees).

FIG. 5C is an enlarged view of a region including conductive particles in a comparative example.

FIG. 5D is another enlarged view of the first pattern region P1 in FIG. 4 (shown by FIGS. 6A to 9 are cross-sectional views illustrating a manufacturing process of the semiconductor light emitting device 150 in the display device 100 according to the embodiment.

FIG. 10 is another cross-sectional view of a first semiconductor light emitting device region 150L1 among regions A2 which is one pixel in FIG. 2.

FIGS. 11A and 11B are cross-sectional views illustrating another process of a first semiconductor light emitting device region 150L1 among regions A2 that is one pixel in FIG. 2.

MODE FOR INVENTION

Hereinafter, embodiments disclosed in the present description will be described in detail with reference to the accompanying drawings. The suffixes 'module' and 'part' for components used in the following description are given or mixed in consideration of ease of specification, and do not have a meaning or role distinct from each other by themselves. In addition, the accompanying drawings are provided for easy understanding of the embodiments disclosed in the present specification, and the technical ideas disclosed in the present specification are not limited by the accompanying drawings. In addition, when an element, such as a layer, region, or substrate, is referred to as being 'on' another component, this includes that it is directly on the other element or there can be other intermediate elements in between.

The display device described in this specification can include a mobile phone, a smart phone, a laptop computer, a digital broadcasting terminal, a personal digital assistant (PDA), a portable multimedia player (PMP), a navigation, a Slate PC, a Tablet PC, an Ultra-Book, a digital TV, a desktop computer, and the like. However, the configuration according to the embodiment described in this specification can be applied to a display capable device even if it is a new product form to be developed later.

Hereinafter, a semiconductor light emitting device according to an embodiment and a display device including the same will be described.

FIG. 1 is an exemplary view in which the display device 100 according to the embodiment is disposed in the living room together with the washing machine 10, the robot cleaner 20, the air purifier 30, and the like.

The display device 100 of the embodiment can display the state of various electronic products such as the air cleaner 30, the robot cleaner 20, the washing machine 10, and communicate with each electronic product based on IOT and can control each electronic product based on user's setting data.

The display device 100 according to the embodiment can include a flexible display manufactured on a thin and flexible substrate. The flexible display can be bent or rolled like paper while maintaining the characteristics of a conventional flat panel display.

In the flexible display, visual information can be implemented by independently controlling light emission of unit pixels arranged in a matrix form. The unit pixel means a minimum unit for realizing one color. The unit pixel of the flexible display can be implemented by a semiconductor light emitting device. In an embodiment, the semiconductor light emitting device can be a Micro-LED, but is not limited thereto.

Next, FIG. 2 is an enlarged view of region A1 in the display device 100 of FIG. 1, and FIG. 3 is a cross-sectional view of the first semiconductor light emitting device region 150L1 of region A2 which is one pixel in FIG. 2.

Referring to FIG. 2, the display device 100 according to the embodiment can drive the semiconductor light emitting device using an active matrix (AM) method or a passive matrix (PM) method.

In addition, the display device 100 of the embodiment can implement a display by a plurality of pixels (A2), and each pixel A2 can include a semiconductor light emitting device region 150L including a plurality of semiconductor light emitting device regions 150L1, 150L2, and 150L3.

Next, referring to FIG. 3, in the display device 100 of the embodiment, the first semiconductor light emitting device region 150L1 can include a panel substrate 110, a first wiring electrode 121, a second wiring electrode 122, an insulating layer 130, and a plurality of semiconductor light emitting devices 150.

Each semiconductor light emitting device 150 can be a red, green, and blue semiconductor light emitting device to form a sub-pixel, but is not limited thereto, and can include a red phosphor and a green phosphor to implement red and green, respectively.

The panel substrate 110 can be formed of glass or polyimide. In addition, the panel substrate 110 can include a flexible material such as polyethylene naphthalate (PEN) or polyethylene terephthalate (PET). In addition, the panel substrate 110 can be made of a transparent material, but is not limited thereto.

The insulating layer 130 can include an insulating and flexible material such as polyimide, PEN, PET, etc., and can be formed integrally with the panel substrate 110 to form a single substrate.

The insulating layer 130 can be an adhesive insulating layer, or can be a conductive adhesive layer having conductivity. The insulating layer 130 can be flexible to enable a flexible function of the display device.

The first wiring electrode 121 and the second wiring electrode 122 can include a metal material having excellent electrical conductivity. For example, the first wiring electrode 121 and the second wiring electrode 122 can be formed at least one of titanium (Ti), chromium (Cr), nickel (Ni), aluminum (Al), platinum (Pt), gold (Au), tungsten (W), molybdenum (Mo), or an alloy thereof.

The semiconductor light emitting device 150 can include light emitting structure 151, epitaxial structure 151S, first pad electrode 153A, second pad electrode 153B, passivation layer 159, first pattern structure 154A, second pattern structure 154B. Details will be described with reference to FIG. 4.

FIG. 4 is an exemplary diagram of a semiconductor light emitting device 150 applied to the display device 100 of the embodiment shown in FIG. 3. The semiconductor light emitting device 150 that can be employed in the embodiment is not limited to the flip type semiconductor light emitting device as shown in FIG. 4, can include a lateral type semiconductor light emitting device or a vertical type semiconductor light emitting device.

The semiconductor light emitting device 150 is a p-n junction diode in which electrical energy is converted into light energy, and can be made of a compound semiconductor including elements of Groups III and V on the periodic table, and can implement various colors such as red, green, and blue by controlling the band gap energy by adjusting the composition ratio of the compound semiconductor.

Referring to FIG. 4, the semiconductor light emitting device 150 of the embodiment can include a light emitting structure 151 and a first pad electrode 153A and a second pad electrode 153B for applying power to the light emitting structure 151.

The light emitting structure 151 can include a first conductivity type semiconductor layer 151*a*, an active layer 151*b*, and a second conductivity type semiconductor layer 151*c*. The first conductivity type can be n-type, and the second conductivity type can be p-type, but is not limited thereto.

The first conductivity type semiconductor layer 151*a* can be implemented as a group III-V compound semiconductor doped with a first conductivity type dopant, when the first conductivity-type semiconductor layer 151*a* is an n-type semiconductor layer, the first conductivity-type dopant is an n-type dopant and can include Si, Ge, Sn, Se, or Te, but is not limited thereto.

The active layer 151*b* is a layer in which electrons injected through the first conductivity type semiconductor layer 151*a* and holes injected through the second conductivity-type semiconductor layer 151*c* to be formed later meet each other to emit light having an energy determined by an energy band unique to the active layer (light emitting layer) material.

The active layer 151*b* can be formed of at least one of a single quantum well structure, a multi-quantum well structure (MQW), a quantum-wire structure, or a quantum dot structure.

The well layer/barrier layer of the active layer 151*b* can be formed in any one or more pair structures of InGaN/GaN, InGaN/InGaN, GaN/AlGaN, InAlGaN/GaN, GaAs (InGaAs), /AlGaAs, GaP (InGaP) or/AlGaP, but is not limited thereto.

The second conductivity-type semiconductor layer 151*c* can include a group III-group-V compound semiconductor doped with a second conductivity-type dopant, for example, a semiconductor material having the composition formula $In_xAl_yGa_{1-x-y}N$ ($0 \le x \le 1$, $0 \le y \le 1$, $0 \le x+y \le 1$). When the second conductivity-type semiconductor layer 151*c* is a p-type semiconductor layer, the second conductivity-type dopant is a p-type dopant and can include Mg, Zn, Ca, Sr, Ba, or the like.

The first pad electrode 153A and the second pad electrode 153B can be electrically connected to the first wiring electrode 121 and the second wiring electrode 122 of the panel substrate 110, respectively.

The first pad electrode 153A and the second pad electrode 153B can include an ohmic layer, a reflective layer, a bonding layer, and the like. For example, when the first pad electrode 153A and the second pad electrode 153B include an ohmic layer, the first pad electrode 153A and the second pad electrode 153B can include the ohmic layer in which a single metal, a metal alloy, a metal oxide, or the like is stacked in multiples so as to efficiently inject a carrier.

For example, the ohmic layer can be formed to include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, Hf, but is not limited to these materials.

In addition, when the first pad electrode 153A and the second pad electrode 153B include a reflective layer, the first pad electrode 153A and the second pad electrode 153B can include a reflective layer formed of a metal layer including Al, Ag, or an alloy containing Al or Ag.

In addition, the first pad electrode 153A and the second pad electrode 153B can include a bonding layer such as nickel (Ni) or gold (Au).

Meanwhile, the semiconductor light emitting device 150 according to the embodiment can include an epitaxial structure 151S that does not have a light emitting function.

The epitaxial structure 151S can include a first conductivity type semiconductor layer 151*a*, an intrinsic semiconductor layer 151*bs* and a second conductivity type semiconductor layer 151*c*, and the first pad electrode 153A is disposed on the epitaxial structure 151S.

The first pad electrode 153A can include the first-first pad electrode 153*a*1 disposed on the first conductivity-type semiconductor layer 151*a* of the epitaxial structure 151S and the first-second pad electrode 153*a*2 disposed on the intrinsic semiconductor layer 151*bs* and the second conductivity-type semiconductor layer 151*c* of the epi-structure 151S.

Accordingly, since the anode power is not applied to the second conductivity type semiconductor layer 151*c* of the epitaxial structure 151S, the intrinsic semiconductor layer 151*bs* does not function as an active layer.

According to the embodiment, as the first pad electrode 153A is disposed on the epitaxial structure 151S, the height of the first pad electrode 153A and the height of the second pad electrode 153B can be matched. When the semiconductor light emitting device 150 is bonded to the panel substrate, flatness can be increased, so that the accuracy and reliability of the bonding process can be improved.

One of the technical problems of the embodiment is to provide a semiconductor light emitting device and a display device including the same capable of solving a problem in which electrical properties are deteriorated or circuit breakage occurs due to the lateral flow of conductive particles as the bonding pressure is applied to the panel substrate of the semiconductor light emitting device using conductive particles in the transfer process.

In addition, one of the technical problems of the embodiment is to provide a semiconductor light emitting device and a display device including the same capable of solving a problem in that the electrical conductivity is lowered due to the low distribution rate of conductive particles captured by the pad electrode of the semiconductor light emitting device and the low adhesion rate, in transferring a semiconductor light emitting device using conductive particles to a panel substrate.

In addition, one of the technical problems of the embodiment is to provide a semiconductor light emitting device and a display device including the same capable of solving a problem in which the mechanical reliability in the bonding process is lowered due to damage to the pad electrode, the wiring electrode, or the conductive particles by the pressure of the bonding process, or the electrical and mechanical reliability of the semiconductor light emitting device is lowered when the display is driven after the bonding process, in transferring a semiconductor light emitting device through a bonding process on a panel substrate using conductive particles.

Referring to FIG. 4, in order to solve the technical problem, the semiconductor light emitting device 150 of the embodiment can include a first pattern structure 154A disposed on the first pad electrode 153A and a second pattern structure 154B disposed on the second pad electrode 153B.

The first pattern structure 154A can include a first metal pattern structure 154*a*1 disposed on the first pad electrode 153A, and a first conductive particle 154*a*3 disposed in the first metal pattern structure **154*a*1. A first adhesive material 154*a*2 can be disposed on the first pattern structure 154A to improve adhesion of the first conductive particle 154*a*3**.

In addition, the second pattern structure 154B can include a second metal pattern structure **154*b*1 disposed on the second pad electrode 153B, and a second conductive particle 154*b*3 disposed in the second metal pattern structure 154*b*1. A second adhesive material 154*b*2 can be disposed on the second pattern structure 154B to improve adhesion of the second conductive particle 154*b*3**.

The first metal pattern structure **154*al* and the second metal pattern structure 154*b*3 can be a metal structure, and can be formed of a material with high ductility or a low-melting-point metal that is relatively flexible. For example, the first metal pattern structure 154*al* and the second metal pattern structure 154*b*3** can be any one of Sn, In, Pb, Bi, Cu, Ag, Al, AuSn, SnBi, or an alloy thereof, but is not limited thereto.

According to the embodiment, as the bonding pressure is applied to the panel substrate of the semiconductor light emitting device using conductive particles in the transfer process, there is a technical effect of improving the electrical properties by solving the problem of deterioration of electrical properties or circuit breakage due to the lateral flow of conductive particles.

In addition, according to the embodiment, in transferring the semiconductor light emitting device using the conductive particles to the panel substrate, there is a technical effect of remarkably improving the electrical conductivity by solving the problem of a decrease in electrical conductivity due to a low distribution rate of conductive particles captured by a pad electrode of a semiconductor light emitting device and a low adhesion rate.

In addition, according to the embodiment, in transferring the semiconductor light emitting device through a bonding process on the panel substrate using conductive particles, there is a technical effect of remarkably improving electrical and mechanical reliability by solving the problem in which the mechanical reliability in the bonding process is lowered due to damage to the pad electrode, the wiring electrode, or the conductive particles by the pressure of the bonding process, or the electrical and mechanical reliability of the semiconductor light emitting device when the display is driven after the bonding process is lowered.

Hereinafter, the technical features of the embodiment will be described in more detail with reference to FIGS. 4 and 5A to 5D.

FIG. 5A is an enlarged view of the first pattern region P1 in FIG. 4 (shown rotated by 180 degrees), and FIG. 5B is another enlarged view of the first pattern region P1 in FIG. 4 (shown by being rotated 180 degrees).

FIG. 5C is an enlarged view of a region including conductive particles in a comparative example.

FIG. 5D is another enlarged view illustrating the first pattern region P1 in FIG. 4 (shown after being rotated 180 degrees).

Referring to FIG. **5*a*, in the embodiment the first pattern structure (154A) can include a first metal pattern structure 154*a*1 including a predetermined first pattern space 154*ap*1, and a first conductive particle 154*a*3 disposed in the first metal pattern structure 154*a*1. A first adhesive material 154*a*2 can be disposed on the first pattern structure 154A to improve adhesion of the first conductive particle 154*a*3. The first pattern space 154*ap*1** can have a polyhedral shape, but is not limited thereto.

The first adhesive material **154*a*2 can be a conductive adhesive material or a non-conductive adhesive material. For example, the first adhesive material 154*a*2 can be a paste including a conductive material or a paste including a non-conductive material, but is not limited thereto. The first conductive particle 154*a*3** can be electrically conductive balls, but is not limited thereto.

In addition, referring to FIG. 5B, in the embodiment, the first pattern structure 154A can include a first metal pattern structure **154*a*1 including a predetermined second pattern space 154*ap*2, and a first conductive particle 154*a*3 disposed in the first metal pattern structure 154*a*1. A first adhesive material 154*a*2 can be disposed on the first pattern structure 154A to improve adhesion of the first conductive particle 154*a*3. The second pattern space 154*ap*2** can have an irregular shape, but is not limited thereto.

Referring to FIG. 5C, in the comparative example having a pattern structure 40, the conductive particles **40*a*3 are adhered in a state in which the adhesive material 40*a*2 is coated on the predetermined structure 40*a*1**.

A semiconductor light emitting device according to an embodiment and a display device including the same can significantly increase the content of the first adhesive material **154*a*2 by the first pattern space 154*ap*1 or the second pattern space 154*ap*2 of the first pattern structure 154A. As the adsorption amount of the first conductive particle 154*a*3** can be increased, there is a technical effect of remarkably improving electrical conductivity by remarkably improving adhesion.

Specifically, according to the embodiment, as the space in which the conductive particles are to be located increases by the first pattern space **154*ap*1 or the second pattern space 154*ap*2 of the first pattern structure 154**A, the arrangement density of the conductive particles can be significantly improved.

In addition, according to the embodiment, by significantly increasing the content of the first adhesive material **154*a*2 disposed in the first pattern space 154*ap*1 or the second pattern space 154*ap*2 of the first pattern structure 154A, three-dimensional contact is possible from the side to the outer surface of the upper surface rather than the point contact from the bottom of the conductive particle 154*a*3. So, it is possible to significantly improve the arrangement density of the conductive particle 154*a*3 and at the same time to significantly improve the contact force of the conductive particle 154*a*3** thereby improving electrical conductivity and electrical reliability.

In the embodiment, the depth of the first pattern space **154*ap*1 or the second pattern space 154*ap*2 can be smaller than the diameter of the conductive particle 154*a*3. For example, in the embodiment, the depth of the first pattern space 154*ap*1 or the second pattern space 154*ap*2 can be about 500 nm to 10 μm. As the diameter of the conductive particle 154*a*3 is formed to be less than about 10 μm, the three-dimensional space such as the bottom surface and the side surface of the conductive particle 154*a*3 can be in three-dimensional contact from the side surface to the outer surface of the top surface by the first adhesive material 154*a*2 filled in the first pattern space 154*ap*1 or the second pattern space 154*ap*2. Accordingly, it is possible to significantly improve the adhesion of the conductive particles 154*a*3** to improve electrical conductivity and electrical reliability.

Meanwhile, FIG. 5C is an enlarged view of a region including conductive particles in a comparative example.

According to the comparative example, as the adhesive layer **40*a*2 is coated with a single thickness on the pad electrode 40*al* and condensed by surface tension, the volume of the adhesive layer 40*a*2 is small, there is a problem that not only the number of the conductive particles 40*a*3** to be adhered is small, but also the contact force is reduced.

Accordingly, as the bonding pressure is applied in the bonding process in the comparative example, there is a problem in that the conductive particles **40*a*3 are separated to the outside of the side surface of the pad electrode 40*a*1**, resulting in deterioration of electrical characteristics or circuit breakage.

On the other hand, according to the embodiment, as the content of the first adhesive material **154*a*2 disposed in the first pattern space 154*ap*1 or the second pattern space 154*ap*2 of the first pattern structure 154A can be significantly increased, and a three-dimensional contact is possible from the side of the conductive particles 154*a*3 to the outer surface of the upper surface, it is possible to remarkably improve the density of the conductive particles and at the same time to significantly improve the contact force of the conductive particles 154*a*3**.

Further, in the embodiment, as the conductive particles **154*a*3 are disposed in the first pattern structure 154A, the bonding pressure is applied by mechanically blocking the conductive particles 154*a*3** from being separated to the outer side of the pad electrode during the bonding process, etc., there is a complex technical effect that can solve the problem of the deterioration of the electrical characteristics in the electrical connection or the problem of circuit breakage at once.

In addition, according to the embodiment, as the first pattern structure 154A is formed into a porous structure by the predetermined first pattern space **154*ap*1 or the second pattern space 154*ap*2**, external forces such as pressure in the bonding process can be dispersed and can function as a buffer. So, there is a special technical effect that can prevent damage to the pad electrode of the semiconductor light emitting device or damage to the wiring electrode due to the pressure in the bonding process, and to prevent problems such as destruction of conductive particles.

In addition, according to the embodiment, as the conductive particles are disposed in the first pattern structure 154A, the mechanical robustness is excellent even in driving the display device after the bonding process, even if there is an external impact. So, there is a special technical effect that the operational reliability is improved as the conductive particles are not separated from the first pattern structure 154A.

Next, FIG. 5D is another enlarged view of the first pattern region P1 in FIG. 4 (shown after being rotated 180 degrees).

Referring to FIG. 5D, the embodiment can include conductive particles having a multi-layer structure disposed on the first pattern structure 154A, accordingly, there is a technical effect of remarkably improving electrical properties by the multi-layered conductive particles.

For example, in the embodiment, the first pattern structure 154A can include a first metal pattern structure **154*a*1 including a predetermined first pattern space 154*ap*1, the first conductive particle 154*a*3 disposed in the first metal pattern structure 154*a*1 and a second conductive particle 154*a*4 disposed to overlap the first conductive particle 154*a*3** in upper and lower directions.

A first adhesive material **154*a*2 can be disposed on the first pattern structure 154A to improve adhesion between the first conductive particle 154*a*3 and the second conductive particle 154*a*4. The first pattern space 154*ap*1** can have a polyhedral shape, but is not limited thereto.

The formation of the conductive ball of the multi-structure can be implemented by disposing the conductive balls in a multi-layered structure on the conductive ball sheet or by performing a plurality of conductive ball transfer processes.

According to the example, by significantly increasing the content of the first adhesive material **154*a*2 disposed in the first pattern space 154*ap*1 of the first pattern structure 154A and arranging the conductive particles having a multilayer structure in the first pattern space 154*ap*1**, electrical conductivity and electrical reliability can be improved by remarkably improving the batch density of conductive particles and at the same time improving the contact force of the conductive particles.

Next, FIGS. 6A to 9 are cross-sectional views illustrating a manufacturing process of the semiconductor light emitting device 150 in the display device 100 according to the embodiment.

Referring to FIG. 6A, a predetermined semiconductor light emitting device 150 can be prepared and disposed on the pattern substrate 210 on which the corresponding pattern 210P is formed.

The semiconductor light emitting device 150 can include a first preliminary structure **154*c*1 and a second preliminary structure 154*c*2. The first and second preliminary structures 154*c*1 and 154*c*2 can be a metal structure, and a material having high ductility or a low melting point metal that is relatively flexible can be used. For example, the first and second preliminary structures 154*c*1 and 154*c*2** can be any one of Sn, In, Pb, Bi, Cu, Ag, Al, AuSn, SnBi, or an alloy thereof, but are not limited thereto.

The patterned substrate 210 can be formed of a material with high rigidity, and a pattern can be formed on the metal material of the first and second preliminary structures **154*c*1 and 154*c*2**.

In addition in the embodiment, for the surfaces of the first and second preliminary structures (**154*c*1, 154*c*2**), by utilizing the difference in diffusion coefficients between the low-melting-point metal and the deposition surface to have a rough surface after metal deposition, it can be possible to form a metal structure with thin thickness deposition and low pressure.

Then, referring to FIG. 6B, the semiconductor light emitting device 150 can be adhered to the pattern substrate 210 on which the corresponding pattern 210P is formed. This bonding process can be performed through pressure or heat and pressure.

Next, as shown in FIG. **6*c*, the first metal pattern structure 154*a*1 including the first pattern space 154*ap*1 and the second metal pattern structure 154*b*1 including the second pattern space 154*ap*2** can be manufactured.

Next, referring to FIGS. 7A and 7B, by disposing the semiconductor light emitting device 150 on the coating substrate 310 having the adhesive solution 320, the adhesive solution can be sucked into the first metal pattern structure **154*a*1 and the second metal pattern structure 154*b*1. The coating substrate 310** can be a glass substrate or the like as a base substrate.

The adhesive 320 can use a flux in the case of bonding by wetting according to an electrical connection method, in the case of bonding by thermal bonding, a material capable of having adhesive strength and viscosity, such as acrylic, a mixture of acrylic and epoxy, silicone resin solution, and photoresist, as well as flux, can be used.

Next, as shown in FIGS. 8A and 8B, a particle substrate 410 including conductive particles 430 can be prepared. An adhesive layer 420 can be disposed on the particle substrate 410, and the adhesive layer 420 can be formed of a low adhesive material having relatively low adhesiveness.

The particle substrate 410 can be a conductive ball transfer example using a conductive ball sheet on which conductive particles 430 in the form of conductive balls are disposed, but the embodiment is not limited thereto.

According to the embodiment, when bonding the micro-conductive particles **154*a*3 to the molded first metal pattern structure 154*a*1, a method of physically interposed transfer by adjusting the pattern width of the first metal pattern structures 154*al* can be used, or a method of coating an adhesive only between the first metal pattern structures 154*a*1** using surface tension can be used.

Next, FIG. 9 is a cross-sectional view of the first semiconductor light emitting device region 150L1 in which the semiconductor light emitting device 150 manufactured by the manufacturing method according to the embodiment is transferred and bonded onto the panel substrate.

According to the semiconductor light emitting device and the display device including the same according to the embodiment, as the bonding pressure is applied to the panel substrate of the semiconductor light emitting device using conductive particles in the transfer process, there is a technical effect of improving the electrical properties by solving the problem of deterioration of electrical properties or circuit breakage due to the lateral flow of conductive particles.

In addition, according to the embodiment, in transferring the semiconductor light emitting device using the conductive particles to the panel substrate, there is a technical effect of remarkably improving the electrical conductivity by solving the problem of lowering the electrical conductivity due to the low distribution rate of conductive particles captured by the pad electrode of the semiconductor light emitting device and the low adhesion rate.

In addition, according to the embodiment, in transferring the semiconductor light emitting device through a bonding process on the panel substrate using conductive particles, there is a technical effect of remarkably improving electrical and mechanical reliability by solving the problem in which the mechanical reliability in the bonding process is lowered due to damage to the pad electrode, the wiring electrode, or the conductive particles by the pressure of the bonding process, or the electrical and mechanical reliability of the semiconductor light emitting device is lowered when the display is driven after the bonding process.

Next, FIG. 10 is another cross-sectional view of the first semiconductor light emitting device region 150L1 of the region A2 which is one pixel in FIG. 2, which is referred to as a second embodiment.

The semiconductor light emitting device according to the second embodiment can adopt the technical features of the above-described embodiments, and the main features of the second embodiment will be mainly described below.

In the semiconductor light emitting device according to the second embodiment, the second conductive particle **254*a* or 254*b*** can be in the form of electrical connection including metal-internal polymer particles. According to the second embodiment, electrical connection can be possible by transferring silica polymer beads or the like and utilizing wettability through thermal bonding. According to the second embodiment, there is a technical effect of wet bonding with a small amount of solder because the solder is prevented from being pushed out of the pad electrode by excessive pressing and the polymer occupies space instead of the solder volume.

In addition, in the semiconductor light emitting device according to the second embodiment, the second conductive particle **254*a* or 254*b*** can be in a state in which the insulating core contains a plurality of particles coated with a conductive material. In this case, the conductive material is deformed and pressed to the portion to which heat and pressure are applied, so that it has conductivity in the thickness direction of the film.

Next, FIGS. 11A and 11B are other process cross-sectional views of the first semiconductor light emitting device region 150L1 of the region A2 that is one pixel in FIG. 2, which is referred to as a third embodiment.

The semiconductor light emitting device according to the third embodiment can adopt the technical features of the above-described embodiments, and the main features of the third embodiment will be described below.

The third embodiment is an electrical connection type in which solder ball particles are mixed with the first metal pattern structure **154*al***.

For example, referring to FIG. 11A, the semiconductor light emitting device 150 can be disposed after the solder ball 320 is formed on the solder ball substrate 310.

Then, as shown in FIG. 11B, the solder ball 320 can be adsorbed to the first metal pattern structure **154*al* and the second metal pattern structure 154*b*1 of the semiconductor light emitting device 150, the third metal pattern structure 354A and the fourth metal pattern structure 354**B to which the solder ball is transferred can be manufactured.

In the third metal pattern structure 354A, the first solder ball **354*al* can be adsorbed to the first metal pattern structure 154*a*1, in the fourth metal pattern structure 354B, a second solder ball 354*b*1 can be adsorbed to the second metal pattern structure 154*b*1**.

After the semiconductor light emitting device 150 according to the embodiment is manufactured on a semiconductor wafer, it can be bonded to a wiring electrode of a panel substrate with an adhesive, and then divided transfer can be possible through selective LLO.

Alternatively, the semiconductor light emitting device 150 according to the embodiment can be manufactured on a semiconductor wafer, diced for each chip, coated with an adhesive, and then transferred to a wiring electrode of a panel substrate in a pick-and-place method.

INDUSTRIAL APPLICABILITY

The semiconductor light emitting device according to the embodiment is not limited to the micro LED, but also includes a mini LED.

The semiconductor light emitting device according to the embodiment can be applied to a relatively large region LED for lighting and signage in addition to the micro LED display.

In addition, the display device including the semiconductor light emitting device according to the embodiment can include a Digital TV, a mobile phone, a smart phone, a laptop computer, a digital broadcasting terminal, a PDA (personal digital assistants), a PMP (portable multimedia player), a Navigation, a Slate PC, a Tablet PC, an Ultra-Book, a Desktop Computer, etc.

The above description is merely illustrative of the technical idea of the embodiment, and various modifications and variations are possible by those skilled in the art to which the embodiment belongs without departing from the essential characteristics of the embodiment.

Accordingly, the embodiments disclosed in the embodiments are for explanation rather than limiting the technical spirit of the embodiment, and the scope of the technical spirit of the embodiment is not limited by these embodiments.

The protection scope of the embodiment should be interpreted by the claims below, and all technical ideas within the scope equivalent thereto should be interpreted as being included in the scope of the embodiment.

The invention claimed is:

1. A semiconductor light emitting device comprising:
a light emitting structure comprising a first conductivity type semiconductor layer, an active layer and a second conductivity type semiconductor layer;
an epitaxial structure distinct from the light emitting structure and comprising the first conductivity type semiconductor layer, an intrinsic semiconductor layer, and the second conductivity type semiconductor layer;
a first pad electrode electrically connected to the first conductivity type semiconductor layer;
a second pad electrode electrically connected to the second conductivity type semiconductor layer;
a first pattern structure disposed on the first pad electrode; and
a second pattern structure disposed on the second pad electrode,
wherein the first pattern structure comprises:
a first metal pattern structure disposed on the first pad electrode;
a first adhesive material disposed on the first metal pattern structure; and
a first conductive particle disposed in the first metal pattern structure,
wherein the first pad electrode comprises:
a first-first pad electrode disposed on the first conductivity type semiconductor layer of the epitaxial structure; and
a first-second pad electrode disposed on the intrinsic semiconductor layer and the second conductivity type semiconductor layer, and
wherein the first metal pattern structure is electrically connected to the first-first pad electrode and the first-second pad electrode.

2. The semiconductor light emitting device according to claim 1, wherein the first metal pattern structure comprises a first pattern space; and
wherein the first adhesive material is disposed in the first pattern space.

3. The semiconductor light emitting device according to claim 2, wherein the first conductive particle is disposed in the first pattern space.

4. The semiconductor light emitting device according to claim 2, wherein the first pattern space has a polyhedral shape.

5. The semiconductor light emitting device according to claim 2, wherein the first pattern space has an irregular shape,
wherein the first metal pattern structure further comprises a second pattern space,
wherein the second pattern space has an irregular shape.

6. The semiconductor light emitting device according to claim 5, wherein the first adhesive material is disposed up to a same height as that of the first pattern space.

7. The semiconductor light emitting device according to claim 2, wherein a depth of the first pattern space is smaller than a diameter of the first conductive particle.

8. The semiconductor light emitting device according to claim 1, wherein the first pad electrode is disposed on the epitaxial structure.

9. The semiconductor light emitting device according to claim 1, wherein a height of the first pad electrode disposed on the epitaxial structure and a height of the second pad electrode disposed on the light emitting structure are matched.

10. The semiconductor light emitting device according to claim 1, wherein the first pattern structure further comprises first-second conductive particle disposed in the first metal pattern structure and disposed to overlap the first conductive particle in upper and lower directions.

11. The semiconductor light emitting device according to claim 10, wherein the first conductive particle is disposed in the first pattern structure, and a portion of the first-second conductive particle protrudes outside the first pattern structure.

12. A display device comprising:
the semiconductor light emitting device of claim 1;
a panel substrate; and
a first wiring electrode and a second wiring electrode disposed on the panel substrate,
wherein the semiconductor light emitting device is disposed on the first wiring electrode and the second wiring electrode, and
wherein the first and second pad electrodes of the semiconductor light emitting device are electrically connected to the first and second wiring electrodes of the panel substrate, respectively.

13. The semiconductor light emitting device according to claim 1, wherein a lower surface of the first pattern structure is located at a same height as a lower surface of the second pattern structure.

14. The semiconductor light emitting device according to claim 1, wherein the first metal pattern structure comprises a first pattern space, and
wherein a portion of the first conductive particle protrudes outside the first pattern space.

15. The semiconductor light emitting device according to claim 1, wherein the first-first pad electrode is positioned higher than the first-second pad electrode.

16. The semiconductor light emitting device according to claim 1, wherein the first-first pad electrode is positioned higher than the second pad electrode.

17. The semiconductor light emitting device according to claim 1, further comprising a passivation layer disposed to surround the first conductivity type semiconductor layer.

18. The semiconductor light emitting device according to claim 1, wherein the first pattern structure and the second pattern structure are formed by a pattern substrate.

* * * * *